United States Patent [19]

Shindo et al.

[11] Patent Number: 5,025,347

[45] Date of Patent: Jun. 18, 1991

[54] SEMICONDUCTOR DEVICE

[75] Inventors: Masamichi Shindo; Toshiharu Sakurai; Hideo Taguchi; Nobu Izawa, all of Yokohama, Japan

[73] Assignee: Kabushiki Kaisha Toshiba, Kawasaki, Japan

[21] Appl. No.: 336,429

[22] Filed: Apr. 11, 1989

[30] Foreign Application Priority Data

Apr. 13, 1988 [JP] Japan ................... 63-90855

[51] Int. Cl.$^5$ .............................. H05K 7/20
[52] U.S. Cl. ...................... 361/386; 357/81; 361/388
[58] Field of Search ........ 361/392, 394, 386, 388–389, 361/406, 408; 357/81, 80; 174/16.3

[56] References Cited

U.S. PATENT DOCUMENTS 4,914,551  4/1990  Anschel et al. .............. 361/389

FOREIGN PATENT DOCUMENTS 0291400  11/1988  European Pat. Off. .

Primary Examiner—Gregory D. Thompson
Attorney, Agent, or Firm—Foley & Lardner

[57] ABSTRACT

A semiconductor device of a type having a pin grid array, comprises a printed circuit board and a planar metal stem with a plurality of through holes. The stem is made of metal having a coefficient of thermal expansion $\alpha s$. The printed circuit board has a predetermined wiring pattern on its upper surface and is made of a material having a maximum coefficient $\alpha p$ in the widthwise direction. The printed circuit board is superposed over the upper surface of the metal stem. A plurality of lead pins have upper portions inserted into the through holes of the stem and board and are in alignment with each other when the board and the stem are superposed one upon another. Connecting members connect the upper portions of the lead pins with their corresponding wiring patterns. In the semiconductor device, the absolute value $\Delta\alpha$ of the difference between the maximum coefficient $\alpha p$ of the board and the coefficient $\alpha s$ of the stem ($\Delta\alpha = \alpha p - \alpha s$) is less than or equal to "$1.52 \times 10^{-4}/L$" ($\Delta\alpha \leq 1.52 \times 10^{-4}/L$).

3 Claims, 2 Drawing Sheets

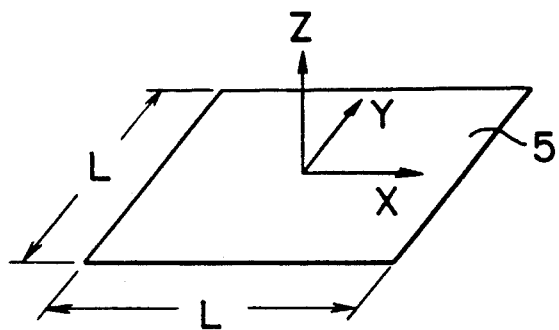
F I G. 3
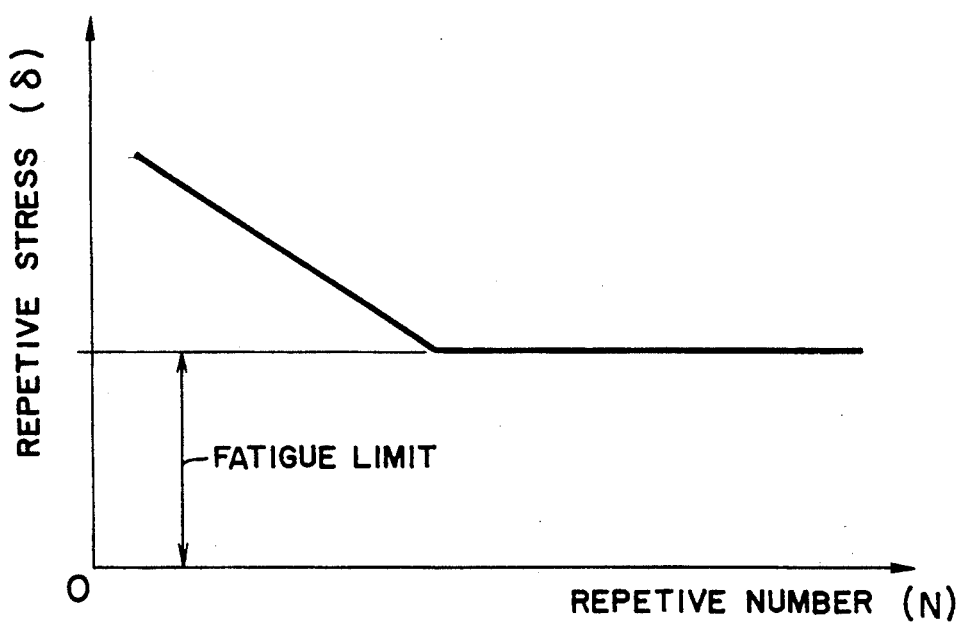
F I G. 4

SEMICONDUCTOR DEVICE

BACKGROUND OF THE INVENTION

The present invention relates to an improvement of semiconductor devices having a high density and especially to large scale integrated circuits (an LSI) of the type in which a printed circuit board upper surface on which are defined wiring patterns superposed over the upper surface of a metal stem. End portions of lead pins extend through the superposed printed circuit board and the metal stem and are connected to corresponding wiring patterns, respectively.

In Dual Inline Packages (DIPs) which are a typical example of pin-insertion type semiconductor packages, the number of pins which can be provided is limited and in practice, is of the order of 60. It has been impossible so far to provide pins in excess of this. In order to provide the pins in excess of a order of 60, a pin insertion type such as Pin Grid Array (a PGA) in which a plurality of pins are extended from the undersurface of the package has been used in general.

Various types of PGAs have been proposed and demonstrated. One is the so-called ceramic type in which a plurality of ceramic substrates are metalized and laminated into a multilayer construction. Another is the so-called plastic type PGA in which printed wiring substrates are replaced by printed circuit board in order to achieve reductions in fabrication costs.

However, the ceramic type PGA is generally very expensive and in the case of the plastic type PGA, there arises the problem that it is generally very difficult to completely air-tightly seal the wiring substrate such as a semiconductor chip, a printed circuit board or the like so that when compared with the ceramic type PGA the reliability of operation is inferior.

In view of the above, the same inventor proposed a semiconductor device of the type which has reliable operation and which is capable of reducing the fabrication costs and can ensure complete air-tight sealing of a semiconductor chip or the like. This device is pending disclsoed in application in S.N. 095 256 and substantially solve the above and other problems encountered in the ceramic type PGA and the plastic type PGA.

The above-proposed semiconductor device will be briefly described with reference to FIGS. 1 and 2. A heat sink 2 is disposed substantially at the center portion of a metal stem 1 and a semiconductor chip 3 is mounted on the upper surface of the heat sink 2. A printed circuit board 5 whose upper surface has predetermined wiring pattern 4 extending radially and outwardly from their starting ends at the center portion around the semiconductor chip, is superposed over the upper surface of the stem 1 and the starting ends at the center portion of the wiring pattern 4 are electrically connected to their corresponding bond pads of the semiconductor chip 3 by bonding wires 6 such as aluminum wires. When the stem 1 and the printed circuit board 5 are overlaid one upon another, the upper end portion of a lead pin 7 is inserted into through holes 1a and 5a which are in alignment with each other and an insulating member 8 such as glass is filled in the annular space defined between the through hole 1a of the metal stem 1 and the lead pin 7 inserted thereinto, and over the upper surface of the printed circuit board 5, the wiring pattern 4 and the lead pin 7 are electrically interconnected with each other by a connecting member such as solder. Furthermore, the upper surfaces of the semiconductor chip 3 and the printed circuit board 5 and their sides are covered with a metal shell 10 so that the semiconductor chip 3 and the printed circuit board 5 are sealed air-tightly.

However, when the semiconductor device of the type disclosed in the above-mentioned copending U.S.S.N. 095,256 is subjected to the temperature cycle test which is defined in, for instance, MIL-STD-883C 1010.5, fatigue of the connecting member 9 such as the solder interconnecting between the upper end of lead pin 7 and the upper surface of the printed circuit board 5 occurs due to the difference in coefficient of thermal expansion between the metal stem 1 and the printed circuit board 5, and with an increase of temperature cycles, the connecting member 9 is finally damaged so that the reliable operation the semiconductor is not ensured.

SUMMARY OF THE INVENTION

In view of the above, the primary object of the present invention is to provide a semiconductor device which can satisfactorily endure a temperature cycle test to such an extent that decrease in reliability of the semiconductor due to the breakdown of the connecting member during the test can be prevented.

To the above and other ends, according to the present invention, in a semiconductor device of the type in which metal stem is superposed over the undersurface of a printed circuit board over the upper surface of which are defined predetermined wiring patterns; and the upper portions of the lead pins are inserted into through holes of the printed circuit board and the metal stem which are in alignment with both the printed circuit board and metal stem are superposed one upon another and are connected to their corresponding wiring patterns, respectively, through connecting members, the absolute value of the difference $\Delta\alpha(=|\alpha p - \alpha s|)$ between the maximum coefficient of thermal expansion $\alpha p$ in the lateral direction of the printed circuit board and the coefficient of thermal expansion $\alpha s$ of the metal stem is selected to be less than or equal to $1.52 \times 10^{-4}/L$ ($\alpha\Delta \leq 1.52 \times 10^{-4}/L$) where L is the maximum width of the lamination consisting of the printed circuit board and the metal stem.

The present invention provides a semiconductor device with the above-described construction so that during the temperature cycle test, stresses in excess of the fatigue limit can be prevented to be produced in the contact members which join the upper ends of the lead pins to the upper surface of the printed circuit board. That is, the breakdown of the contact members can be prevented during the temperature cycle test.

The present invention provides a semicondcutor device with the above-described construction so that during the temperature cycle test, stresses in excess of the fatigue limit can be prevent ed form being produced in the contact members which join the upper ends of the lead pins to the upper surface of the printed circuit board. That is, the breakdown of the contact members can be prevented during the temperature cycle test. Therefore the present invention has the remarkable feature that a high degree of reliability in operation of the semiconductor can be retained even during temperature cycle testing.

BRIEF DESCRIPTION OF THE DRAWINGS

In the accompanying drawings:

FIG. 3 is a top view of a piece to be tested; and

FIG. 4 is an S-N diagram in which repetitive number is plotted along the abscissa while the repetitive stress, along the ordinate.

DESCRIPTION OF THE PREFERRED EMBODIMENT

Figure 1:
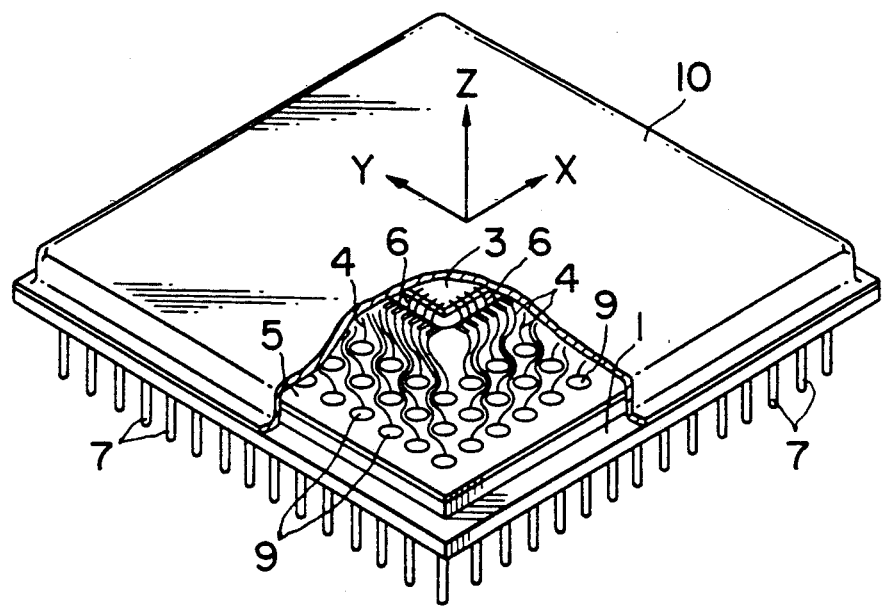
FIG. 1 is a cut-away perspective view of a semiconductor device.
Figure 2:
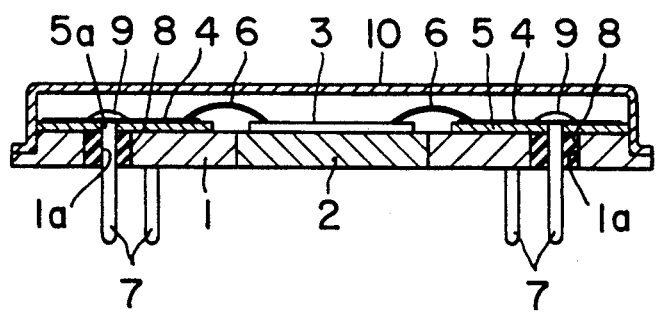
FIG. 2 is a longitudinal sectional view of the semicondcutor device shown in FIG. 1.

Now, referring to the accompanying drawings, a preferred embodiment of the semiconductor device in accordance with the present invention will be described in detail.

A metal stem 1 in the form of a flat plate is made of steel having a coefficient of thermal expansion $\alpha s$ of, of instance, $1.42 \times 10^{-5}$ ($\alpha s = 1.42 \times 10^{-5}$) and has a square upper surface having one side 40 mm in length. A heat sink 2 is disposed substantially at the center portion of the upper surface of the metal stem 1 and a semiconductor chip 3 is mounted on the upper surface of the heat sink 2.

A printed circuit board 5 has an upper surface on which are defined predetermined wiring patterns 4. The printed circuit board 5, which is made of, for instance, FR-4 or G-11 (an NEMA - national Electrical Manufacturers Association -symbol) a coefficient of thermal expansion as shown in TABLE, is superposed over the whole upper surface of the metal stem 1 except at the position of the semiconductor chip 3. The starting ends on the side of the center portion of the wiring pattern 4 of the printed circuit board 5 are electrically connected to their corresponding to bonding pads of the semiconductor chip 3 by bonding wires 6, respectively. The upper end portion of each lead pin 7 is inserted into through holes 1a and 5-a of the metal stem 1 and the printed circuit board 5 which are axially aligned with respect to each other when the metal stem 1 and the printed circuit board 5 are laid in one over another. An insulating members 8 such as glass are filled into the annular space defined between the through hole 1a of the metal stem 1 and lead pins 7 inserted therein and over the upper surface of the printed circuit board 5 the wiring pattern 4 and its corresponding lead pin 7 are electrically interconnected with each other by a connecting member 9 such as solder. Furthermore, the upper surfaces of the semiconductor chip 3 and the printed circuit board 5 and their side surfaces are covered air-tightly by a metal shell 10.

FR-4 and G-11 were selected as materials for the printed circuit board 5 on the basis of the results of the experiments shown in TABLE. The results were obtained by the tests conducted in the following manner. That is, as shown in FIG. 3, a square sheet of steel with one side 40 mm in length, which is the metal stem 1, and CEM-3 (an NEMA symbol), FR-4 or G-11 which has the same as the square sheet of steel and which is one of the materials for the fabricating the printed circuit board 5 (the coefficients of thermal expansion in the mutually perpendicular directions; that is, the lateral directions X and Y and the direction Z of thickness are shown in TABLE) are superposed one upon another. Lead pins 7 are extended through the lamination thus obtained at the positions in the vicinity of its four sides and the upper ends of the lead pins 7 are joined to the square sheet of steel by connecting members 9 by solder or the like. The lamination thus obtained was subjected to the temperature cycle test to check whether or not the connecting member 9 were damaged.

TABLE

| No. | Print Substrate Materials | *Coefficients of Thermal Expansion | | | Vitrification Temperature | **Breakdown Rates in ***Temperature Cycle Tests | | |
|---|---|---|---|---|---|---|---|---|
| | | X Direction | Y Direction | Z Direction | | 300 Cycle | 400 Cycle | 500 Cycle |
| 1 | CEM-3 | $2.3 \times 10^{-5}$ | $2.5 \times 10^{-5}$ | $6.7 \times 10^{-5}$ | 125° C. | 20% | 60% | 80% |
| 2 | FR-4 | $1.3 \times 10^{-5}$ | $1.8 \times 10^{-5}$ | $5.1 \times 10^{-5}$ | 125° C. | 0% | 0% | 0% |
| 3 | G-11 | $1.3 \times 10^{-5}$ | $1.3 \times 10^{-5}$ | $6.0 \times 10^{-5}$ | 180° C. | 0% | 0% | 0% |

*Coefficients of thermal expansion are lower than the vitrification temperature.
**Breakdown rates indicate accumulated values.
***Temperature cycle test: MIL-STD-883C 1010.5

According to the test results shown in TABLE, when CEM-3 is used as the printed circuit board 5, the contact member 9 which joins the lead pins 7 are damaged while when FR-4 or G-11 is used as the printed circuit board 5, no breakdown of the contact member 9 occurred. It is therefore considered that when FR-4 or G-11 is used as the printed circuit board 5, only stresses lower than the so-called fatigue limit shown as the S-N diagram of FIG. 4 is which the repetitive number N is plotted along the abscissa while the repetitive stress $\sigma$, along the ordinate.

In the tests conducted in the manner described above, the maximum coefficient of thermal expansion in the widthwise direction (X and Y directions) is the coefficient of thermal expansion of $1.8 \times 10^{-5}$ in the Y direction of FR-4. The above-mentioned maximum coefficient is defined as the coefficient $\alpha p$ ($= 1.8 \times 10^{-5}$) of the printed circuit board 5. It is considered that the longer the width L, the greater the deformations around the periphery of the printed circuit board 5 and the stronger the stress $\sigma$ resulting in the breakdown of the contact members.

That is, according to the above-described test results, the difference $\Delta \alpha$ between the coefficient of thermal expansion $\alpha p = 1.8 \times 10^{-5}$ of the printed circuit board 5 and the coefficient thermal expansion $\alpha s = 1.42 \times 10^{-5}$ of the metal stem 1 becomes $$\begin{aligned}\Delta \alpha &= \alpha p - \alpha s \\ &= 1.8 \times 10^{-5} - 1.42 \times 10^{-5} \\ &= 0.38 \times 10^{-5}\end{aligned}$$

When general difference in coefficient of thermal expansion in the case that the maximum lamination width L($=40$ mm) of the lamination consisting o the stem 1 and the printed circuit board 5 is defined as X, $$0.38 \times 10^{-5} \times 40 = X \times L$$

Hence, $X = 1.52 \times 10^{-4}/L$

It is therefore considered that when X is less than or equal to $1.52 \times 10^{-4}$ (that is, when $\Delta\alpha \times X = 1.52 \times 10^{-4}/L$), only the stresses lower than the fatigue limit indicated in FIG. 4 are produced so that the breakdown of the contact members 9 under such stresses can be avoided.

It follows therefore than when the materials of the metal stem 1 and the printed circuit board 5 are suitably combined within the above-mentioned range of the coefficient of thermal expansion, the breakdown of the contact members 9 for the lead pins 7 can be avoided in the temperature cycle test.

What is claimed is:

1. A semiconductor device comprising:
   a metal stem having a planar shape and a plurality of through holes, and being made of metal having a coefficient of thermal expansion $\alpha s$;
   a printed circuit board having wiring patterns on its upper surface and a plurality of through holes, being made of a material having a maximum coefficient $\alpha p$ in the widthwise direction, and being superposed over the upper surface of said metal stem to form a lamination, said lamination having a maximum width (L);
   a plurality of lead pins having upper portions inserted into said through holes of said stem and board which are in alignment with each other when said board and said stem are superposed one upon another; and
   connecting members for connecting said upper portions of said lead pins with corresponding wiring pattern;
   wherein an absolute value $\Delta\alpha$ of the difference between said maximum coefficient $\alpha p$ of said board and said coefficient $\alpha s$ of said stem ($\Delta\alpha = \alpha p - \alpha s$) is less than or equal to about "$1.52 \times 10^{-4}/L$" ($\Delta\alpha \leq 1.52 \times 10^{-4}/L$).

2. A semiconductor device according to claim 1 wherein;
   said metal stem is made of steel in the form of a flat plate halving a coefficient of thermal expansion $\alpha s$ of $1.42 \times 10^{-5}$ ($\alpha s = 1.42 \times 10^{-5}$) and has a square upper surface having one side 40 millimeters in length; and
   said printed circuit board is made of a material which has a coefficient of thermal expansion of "$1.3 \times 10^{-5}$" in one widthwise direction (X) and a coefficient of thermal expansion of "$1.8 \times 10^{-5}$" in another direction (Y).

3. A semiconductor device according to claim 2 wherein;
   said metal stem is made of steel in the form of a flat plate having a coefficient of thermal expansion $\alpha s$ of $1.42 \times 10^{-5}$ ($\alpha s = 1.42 \times 10^{-5}$) and has a square upper surface having one side 40 millimeters in length; and
   said printed circuit board is made of material which has a coefficient of thermal expansion of "$1.3 \times 10^{-5}$" in one widthwise direction (X) and a coefficient of thermal expansion of "$1.3 \times 10^{-5}$" in another direction (Y).

* * * * *